United States Patent
Hsu et al.

(10) Patent No.: US 12,013,630 B2
(45) Date of Patent: Jun. 18, 2024

(54) EUV PHOTO MASKS AND MANUFACTURING METHOD THEREOF

(71) Applicant: TAIWAN SEMICONDUCTOR MANUFACTURING COMPANY, LTD., Hsinchu (TW)

(72) Inventors: Pei-Cheng Hsu, Hsinchu (TW); Ta-Cheng Lien, Hsinchu (TW); Hsin-Chang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/991,740

(22) Filed: Nov. 21, 2022

(65) Prior Publication Data

US 2023/0085685 A1    Mar. 23, 2023

Related U.S. Application Data (63) Continuation of application No. 17/109,833, filed on Dec. 2, 2020, now Pat. No. 11,506,969.

(60) Provisional application No. 63/030,035, filed on May 26, 2020.

(51) Int. Cl.
   *G03F 1/24*    (2012.01)
(52) U.S. Cl.
   CPC ................................. *G03F 1/24* (2013.01)
(58) Field of Classification Search
   CPC ........................................... G03F 1/24
   USPC ............................................. 430/5
   See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 11,243,461 B2 | 2/2022 | Wu et al. |
| 2007/0160916 A1 | 7/2007 | Ikuta et al. |
| 2020/0026178 A1 | 1/2020 | Jindal et al. |

FOREIGN PATENT DOCUMENTS

| | | |
|---|---|---|
| TW | 202000954 A | 1/2020 |
| TW | 202008073 A | 2/2020 |
| TW | 202016643 A | 5/2020 |

OTHER PUBLICATIONS

Notice of Allowance issued in U.S. Appl. No. 17/109,833 dated Jul. 18, 20223.

*Primary Examiner* — Christopher G Young
(74) *Attorney, Agent, or Firm* — STUDEBAKER & BRACKETT PC (57) ABSTRACT

A reflective mask includes a substrate, a reflective multilayer disposed over the substrate, a capping layer disposed over the reflective multilayer, an intermediate layer disposed over the capping layer, an absorber layer disposed over the intermediate layer, and a cover layer disposed over the absorber layer. The intermediate layer includes a material having a lower hydrogen diffusivity than a material of the capping layer.

20 Claims, 10 Drawing Sheets

EUV PHOTO MASKS AND MANUFACTURING METHOD THEREOF

RELATED APPLICATIONS

This application is a continuation of U.S. patent application Ser. No. 17/109,833 filed Dec. 2, 2020, now U.S. Pat. No. 11,506,969, which claims priority to U.S. Provisional Patent Application No. 63/030,035 filed May 26, 2020, the entire contents of each of which are incorporated herein by reference.

BACKGROUND

Photolithography operations are one of the key operations in the semiconductor manufacturing process. Photolithography techniques include ultraviolet lithography, deep ultraviolet lithography, and extreme ultraviolet lithography (EUVL). The photo mask is an important component in photolithography operations. It is critical to fabricate EUV photo masks having a high contrast with a high reflectivity part and a high absorption part.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, processes and/or dimensions as explained with respect to one embodiment may be employed in other embodiments and detailed description thereof may be omitted.

Embodiments of the present disclosure provide a method of manufacturing an EUV photo mask. More specifically, the present disclosure provides techniques to prevent or suppress damage on a backside conductive layer of an EUV photo mask.

EUV lithography (EUVL) employs scanners using light in the extreme ultraviolet (EUV) region, having a wavelength of about 1 nm to about 100 nm, for example, 13.5 nm. The mask is a critical component of an EUVL system. Because the optical materials are not transparent to EUV radiation, EUV photo masks are reflective masks. Circuit patterns are formed in an absorber layer disposed over the reflective structure. The absorber layer has a low EUV reflectivity, for example, less than 3-5%.

The present disclosure provides an EUV reflective photo mask having a low reflective (high absorbing) absorber structure.

Figure 1A:
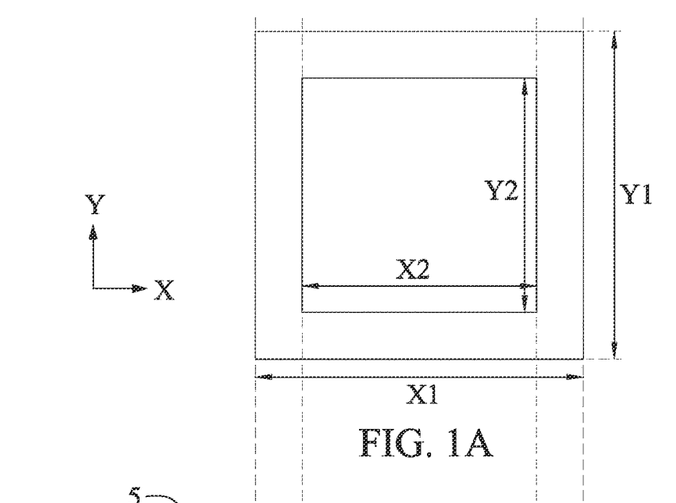
FIGS. 1A, 1B, 1C and 1D show EUV photo mask blanks according to embodiments of the present disclosure.
Figure 1B:
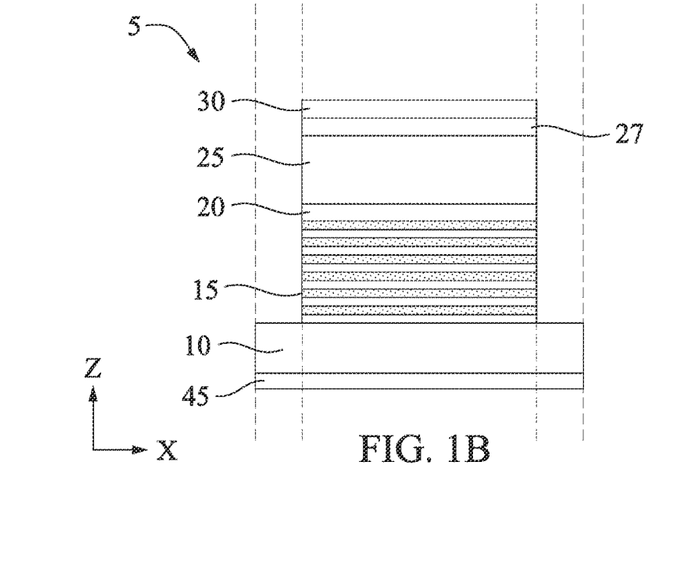

FIGS. 1A and 1B show an EUV reflective photo mask blank according to an embodiment of the present disclosure. FIG. 1D shows a patterned EUV reflective photo mask ready for use in EUV lithography. FIG. 1A is a plan view (viewed from the top) and FIG. 1B is a cross sectional view along the X direction.

In some embodiments, the EUV photo mask with circuit patterns is formed from an EUV photo mask blank 5. The EUV photo mask blank 5 includes a substrate 10, a multi-layer Mo/Si stack 15 of multiple alternating layers of silicon and molybdenum, a capping layer 20, an absorber layer 25, a cover (or antireflective) layer 27 and a hard mask layer 30. Further, a backside conductive layer 45 is formed on the backside of the substrate 10, as shown in FIG. 1B.

The substrate 10 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the size of the substrate 10 is 152 m×152 mm having a thickness of about 20 mm. In other embodiments, the size of the substrate 10 is smaller than 152 m×152 mm and equal to or greater than 148 m×148 mm. The shape of the substrate 10 is square or rectangular in some embodiments.

In some embodiments, the functional layers above the substrate (the multilayer Mo/Si stack 15, the capping layer 20, the absorber layer 25, the cover layer 27 and the hard mask layer 30) have a smaller width than the substrate 10. In some embodiments, the size of the functional layers is in a range from about 138 m×138 mm to 142 mm×142 mm. The shape of the functional layers is square or rectangular in some embodiments.

Figure 1C:
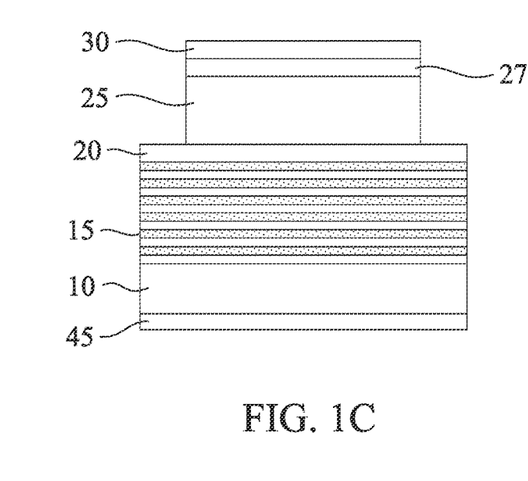
Figure 1D:
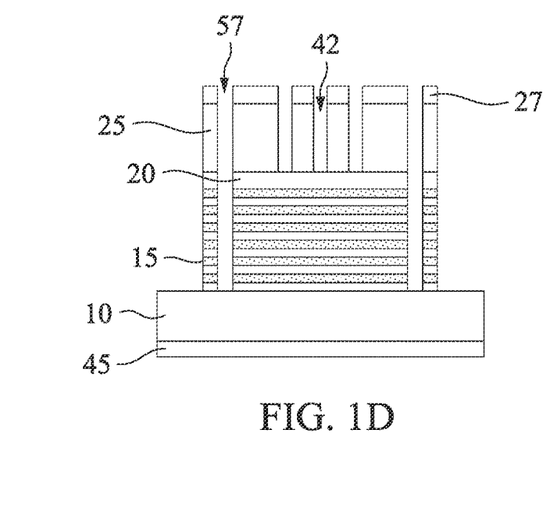

In other embodiments, the absorber layer 25, the cover layer 27 and the hard mask layer 30 have a smaller size in the range from about 138 m×138 mm to 142 mm×142 mm than the substrate 10, the multilayer Mo/Si stack 15 and the capping layer 20 as shown in FIG. 1C. The smaller size of one or more of the functional layers can be formed by using a frame shaped cover having an opening in a range from about 138 m×138 mm to 142 m×142 mm, when forming the respective layers by, for example, sputtering. In other embodiments, all of the layers above the substrate 10 have the same size as the substrate 10.

In some embodiments, the Mo/Si multilayer stack 15 includes from about 30 alternating layers each of silicon and molybdenum to about 60 alternating layers each of silicon and molybdenum. In certain embodiments, from about 40 to about 50 alternating layers each of silicon and molybdenum are formed. In some embodiments, the reflectivity is higher than about 70% for the wavelengths of interest e.g., 13.5 nm. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each silicon layer is about 4 nm and the thickness of each molybdenum layer is about 3 nm. In some embodiments, the bottommost layer of the multilayer stack 15 is a Si layer or a Mo layer.

In other embodiments, the multilayer stack 15 includes alternating molybdenum layers and beryllium layers. In some embodiments, the number of layers in the multilayer stack 15 is in a range from about 20 to about 100 although any number of layers is allowed as long as sufficient reflectivity is maintained for imaging the target substrate. In some embodiments, the reflectivity is higher than about 70% for the wavelengths of interest e.g., 13.5 nm. In some embodiments, the multilayer stack 15 includes about 30 to about 60 alternating layers of Mo and Be. In other embodiments of the present disclosure, the multilayer stack 15 includes about 40 to about 50 alternating layers each of Mo and Be.

The capping layer 20 is disposed over the Mo/Si multilayer 15 to prevent oxidation of the multilayer stack 15 in some embodiments. In some embodiments, the capping layer 20 is made of elemental ruthenium (not Ru compound), a ruthenium alloy (e.g., RuNb, RuZr, RuZrN, RuRh, RuNbN, RuRhN, RuV or RuVN) or a ruthenium based oxide (e.g., $RuO_2$, RuNbO, RiVO or RuON), having a thickness of from about 2 nm to about 10 nm. In certain embodiments, the thickness of the capping layer 20 is from about 2 nm to about 5 nm. In some embodiments, the capping layer 20 has a thickness of 3.5 nm±10%. In some embodiments, the capping layer 20 is formed by chemical vapor deposition, plasma-enhanced chemical vapor deposition, atomic layer deposition, physical vapor deposition (e.g., sputtering), or any other suitable film forming method. In other embodiments, a Si layer is used as the capping layer 20. One or more layers are disposed between the capping layer 20 and the multilayer 15 as set forth below in some embodiments.

The absorber layer 25 is disposed over the capping layer 20. In some embodiments, the absorber layer 25 is Ta-based material. In some embodiments, the absorber layer 25 is made of TaN, TaO, TaB, TaBO or TaBN having a thickness from about 25 nm to about 100 nm. In certain embodiments, the absorber layer 25 thickness ranges from about 50 nm to about 75 nm. In other embodiments, the absorber layer 25 includes a Cr based material, such as CrN, CrO and/or CrON. In some embodiments, the absorber layer 25 has a multilayered structure of Cr, CrO or CrON. In some embodiments, the absorber layer 25 is formed by chemical vapor deposition, plasma-enhanced chemical vapor deposition, atomic layer deposition, physical vapor deposition, or any other suitable film forming method. One or more layers are disposed between the capping layer 20 and the absorber layer 25 as set forth below in some embodiments.

In some embodiments, a cover or antireflective layer 27 is disposed over the absorber layer 25. In some embodiments, the cover layer 27 includes a Ta based material, such as TaB, TaO, TaBO or TaBN, silicon, a silicon-based compound (e.g., silicon oxide, SiN, SiON or MoSi), ruthenium, or a ruthenium-based compound (Ru or RuB). In certain embodiments, the cover layer 27 is made of tantalum oxide ($Ta_2O_5$ or non-stoichiometric (e.g., oxygen deficient) tantalum oxide), and has a thickness of from about 2 nm to about 20 nm. In other embodiments, a TaBO layer having a thickness in a range from about 2 nm to about 20 nm is used as the cover layer. In some embodiments, the thickness of the cover layer 27 is from about 3 nm to about 10 nm. In some embodiments, the cover layer 27 is formed by chemical vapor deposition, plasma-enhanced chemical vapor deposition, atomic layer deposition, physical vapor deposition, or any other suitable film forming method.

The hard mask layer 30 is disposed over the cover layer 27 in some embodiments. In some embodiments, the hard mask layer 30 is made of a Cr based material, such as CrO, CrON or CrCON. In other embodiments, the hard mask layer 30 is made of a Ta based material, such as TaB, TaO, TaBO or TaBN. In other embodiments, the hard mask layer 30 is made of silicon, a silicon-based compound (e.g., SiN or SiON), ruthenium or a ruthenium-based compound (Ru or RuB). The hard mask layer 30 has a thickness of about 4 nm to about 20 nm in some embodiments. In some embodiments, the hard mask layer 30 includes two or more different material layers. In some embodiments, the hard mask layer 30 is formed by chemical vapor deposition, plasma-enhanced chemical vapor deposition, atomic layer deposition, physical vapor deposition, or any other suitable film forming method.

In some embodiments, the backside conductive layer 45 is disposed on a second main surface of the substrate 10 opposing the first main surface of the substrate 10 on which the Mo/Si multilayer 15 is formed. In some embodiments, the backside conductive layer 45 is made of TaB (tantalum boride) or other Ta based conductive material. In some embodiments, the tantalum boride is crystal. The crystalline tantalum boride includes TaB, $Ta_5B_6$, $Ta_3B_4$ and $TaB_2$. In other embodiments, the tantalum boride is poly crystal or amorphous. In other embodiments, the backside conductive layer 45 is made of a Cr based conductive material (CrN or CrON). In some embodiments, the sheet resistance of the backside conductive layer 45 is equal to or smaller than 20 $\Omega/\square$. In certain embodiments, the sheet resistance of the backside conductive layer 45 is equal to or more than 0.1 $\Omega/\square$. In some embodiments, the surface roughness Ra of the backside conductive layer 45 is equal to or smaller than 0.25 nm. In certain embodiments, the surface roughness Ra of the backside conductive layer 45 is equal to or more than 0.05 nm. Further, in some embodiments, the flatness of the backside conductive layer 45 is equal to or less than 50 nm (within the EUV photo mask). In some embodiments, the flatness of the backside conductive layer 45 is more than 1 nm. A thickness of the backside conductive layer 45 is in a range from about 50 nm to about 400 nm in some embodiments. In other embodiments, the backside conductive layer 45 has a thickness of about 50 nm to about 100 nm. In certain embodiments, the thickness is in a range from about 65 nm to about 75 nm. In some embodiments, the backside conductive layer 45 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering, or any other suitable film forming method. In cases of CVD, source gases include $TaCl_5$ and $BCl_3$ in some embodiments.

FIGS. 2A and 2B to 6A and 6B show various structures of the mask blank ("A" figures) and the patterned photo mask ("B" figures).

Figure 2A:
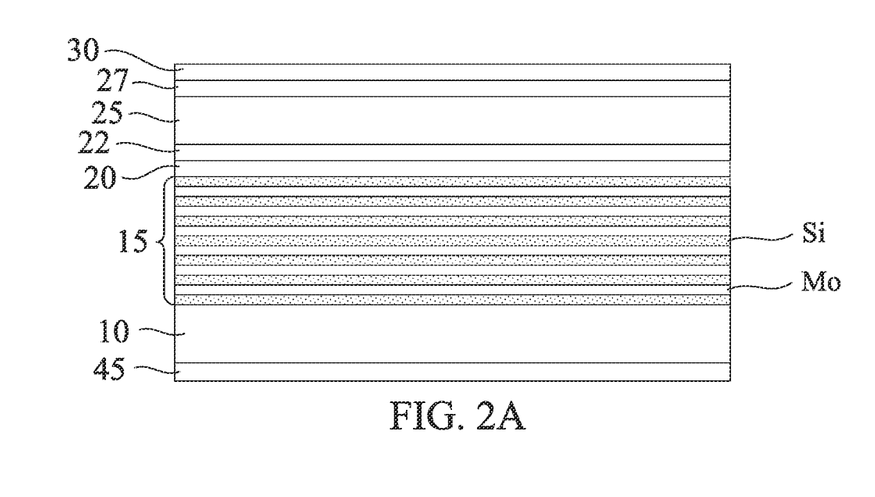
FIG. 2A shows a cross sectional view of a photo mask blank and FIG. 2B shows a cross sectional view of a photo mask according to embodiments of the present disclosure.
Figure 2B:
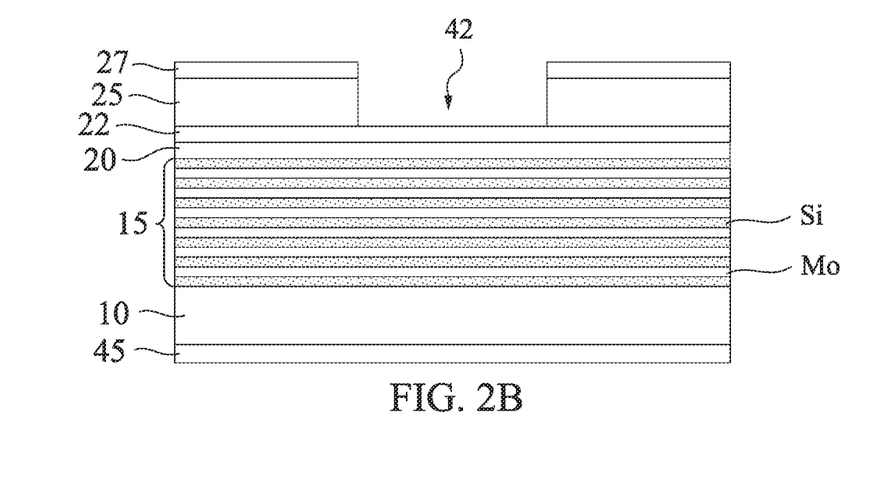

In some embodiments, as shown in FIGS. 2A and 2B, an intermediate layer 22 is formed between the capping layer 20 and the absorber layer 25. The intermediate layer 22 is for protecting the capping layer 20 in some embodiments. In some embodiments, the intermediate layer 22 includes Ta based compound, such as TaB, TaO, TaBO or TaBN, silicon, a silicon-based compound (e.g., silicon oxide, SiN, SiON or MoSi), molybdenum, niobium, niobium oxide, ruthenium, or a ruthenium-based compound ($RuO^2$ or RuB). In other embodiments, the intermediate layer 22 includes a metal oxide, such as, niobium oxide, tantalum oxide, ruthenium oxide and/or molybdenum oxide. In other embodiments, the intermediate layer 22 includes an elemental metal (not compound), such as Mo, Ta, Cr, Ni, Co and/or Ir. In certain embodiments, the intermediate layer 22 is made of tantalum oxide ($Ta_2O_5$ or non-stoichiometric (e.g., oxygen deficient) tantalum oxide). In some embodiments, the intermediate layer 22 is made of the same as or similar material to the cover layer 27. In some embodiments, the intermediate layer 22 has a lower hydrogen diffusivity than Ru (a hydrogen barrier layer) and/or lower carbon solubility or reactivity than Ru (a protection layer from carbon or hydrocarbon contamination).

The intermediate layer 22 has a thickness of about 0.5 nm to about 5 nm in some embodiments and in other embodiments, the thickness is in a range from about 1 nm to about 3 nm. In some embodiments, the intermediate layer 22 is formed by chemical vapor deposition, plasma-enhanced chemical vapor deposition, atomic layer deposition, physical vapor deposition, or any other suitable film forming method. In some embodiments, the intermediate layer 22 functions as an etching stop layer during a patterning operation of the absorber layer.

In other embodiments, the intermediate layer 22 is a photo catalytic layer that can catalyze hydrocarbon residues formed on the photo mask into $CO_2$ and/or $H_2O$ with EUV radiation. Thus an in-situ self-cleaning of the mask surface is performed. In some embodiments, in a EUV scanner system, oxygen and hydrogen gases are injected into the EUV chamber to maintain the chamber pressure (e.g., at about 2 Pa). The chamber background gas can be a source of oxygen. In addition to the photo catalytic function, the photo catalytic layer is designed to have sufficient durability and resistance to various chemicals and various chemical processes, such as cleaning and etching. In some examples, ozonated water used to make the EUV reflective mask, in a subsequent process, damages the capping layer 20 made of Ru and results in a significant EUV reflectivity drop. In addition, after Ru oxidation, Ru oxide is easily etched away by an etchant, such as $Cl_2$ or $CF_4$ gas. In some embodiments, the photo catalytic layer includes one or more of titanium oxide ($TiO_2$), tin oxide (SnO), zinc oxide (ZnO) and cadmium sulfide (CdS). The thickness of the photo catalytic layer 22 is in a range from about 2 nm to about 10 nm in some embodiments, and is in a range from about 3 nm to about 7 nm in other embodiments. When the thickness is too thin, the photo catalytic layer may not sufficiently function as an etch stop layer. When the thickness is too large, the photo catalytic layer may absorb the EUV radiation.

As shown in FIG. 2B, after the circuit pattern 42 is formed, the hard mask layer 30 is removed and thus the EUV photo mask does not include the hard mask layer.

Figure 3A:
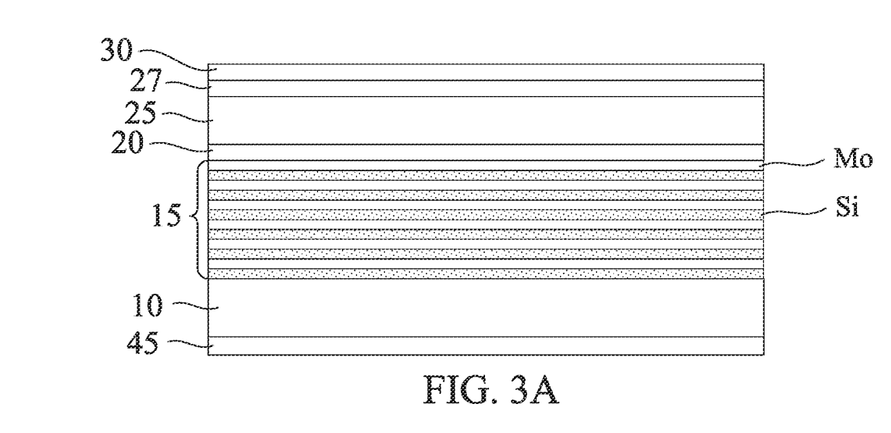
FIG. 3A shows a cross sectional view of a photo mask blank and FIG. 3B shows a cross sectional view of a photo mask according to embodiments of the present disclosure.
Figure 3B:
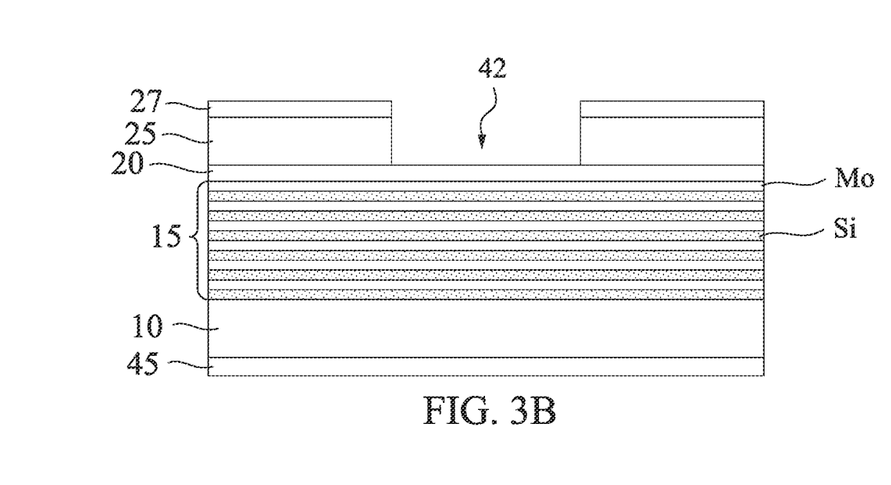

In some embodiments, as shown in FIGS. 3A and 3B, no intermediate layer is formed between the capping layer 20 and the absorber layer 25, and the uppermost layer of the multilayer 15 is a Mo layer. In other words, the uppermost Si layer of the multilayer 15 is not in contact with the capping layer 20. As shown in FIG. 3B, after the circuit pattern 42 is formed, the hard mask layer 30 is removed and thus the EUV photo mask does not include the hard mask layer.

When a Ru or a Ru alloy layer is in direct contact with a Si layer, the Ru based layer may have weak adhesion to the Si layer due to hydrogen diffusion and hydrogen piling-up at the interface between the Ru based layer and the Si layer. In the embodiments shown in FIGS. 3A and 3B, where the multilayer stack 15 is terminated by a Mo layer, it is possible to maintain sufficient bonding or adhesion strength between the capping layer 20 and the multilayer stack 15.

Figure 4A:
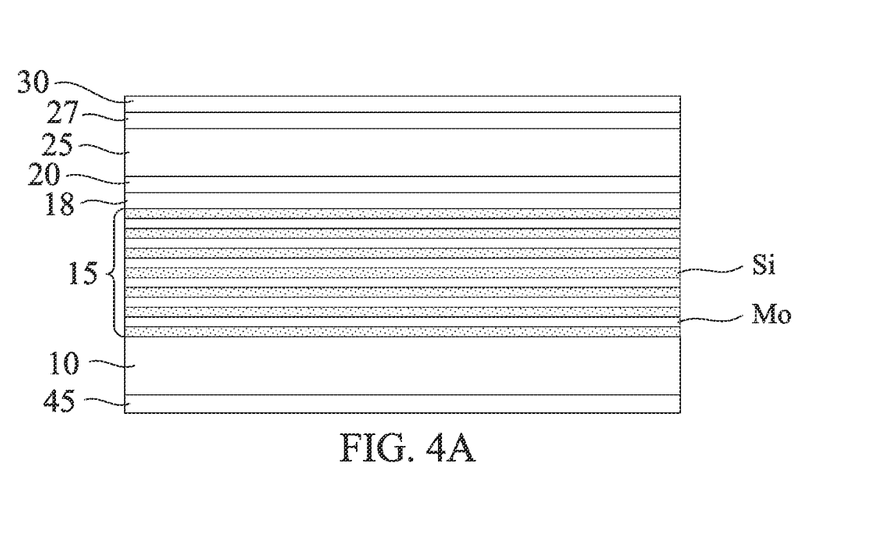
FIG. 4A shows a cross sectional view of a photo mask blank and FIG. 4B shows a cross sectional view of a photo mask according to embodiments of the present disclosure.
Figure 4B:
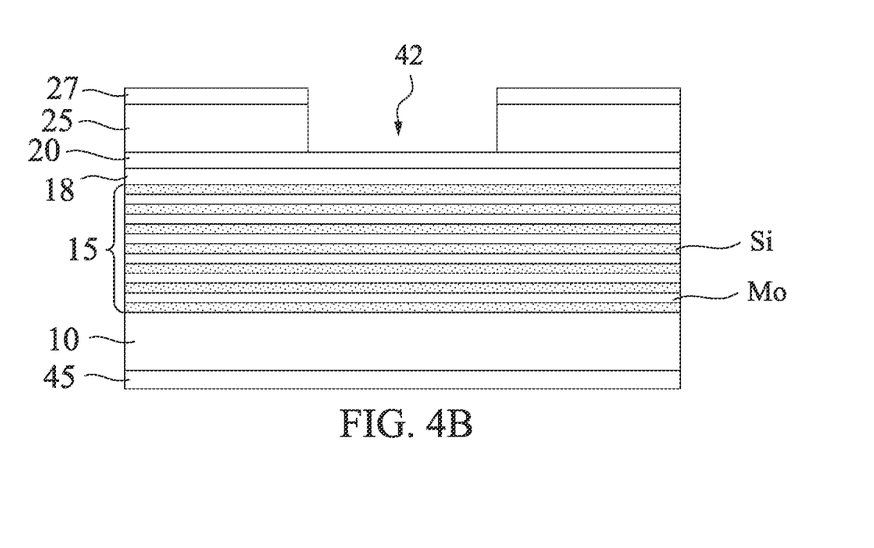

In some embodiments, as shown in FIGS. 4A and 4B, no intermediate layer is formed between the capping layer 20 and the absorber layer 25, and a barrier layer 18 is formed between the multilayer 15 and the capping layer 20. In other words, even if the uppermost layer of the multilayer 15 is a Si layer, the Si layer is not in contact with the capping layer 20. In some embodiments, the barrier layer 18 includes a silicon compound, such as silicon oxide, silicon nitride, SiON and/or SiOCN. In other embodiments, the barrier layer 18 includes a metal oxide, such as, niobium oxide, tantalum oxide, ruthenium oxide and/or molybdenum oxide.

In other embodiments, the barrier layer 18 includes elemental metal (not compound), such as Be, Mo, Ta, Cr, Ni, Co and/or Ir.

In some embodiments, the thickness of the barrier layer 18 is in a range from about 0.5 nm to about 5 nm, and in other embodiments, the thickness is in a range from about 1 nm to about 3 nm. In some embodiments, the barrier layer 18 is formed by chemical vapor deposition, plasma-enhanced chemical vapor deposition, atomic layer deposition, physical vapor deposition, thermal or chemical oxidation, or any other suitable film forming method. As shown in FIG. 4B, after the circuit pattern 42 is formed, the hard mask layer 30 is removed and thus the EUV photo mask does not include the hard mask layer. In some embodiments, the uppermost layer of the multilayer 15 is a Si layer as shown in FIGS. 4A and 4B, or a Mo layer.

Figure 5A:
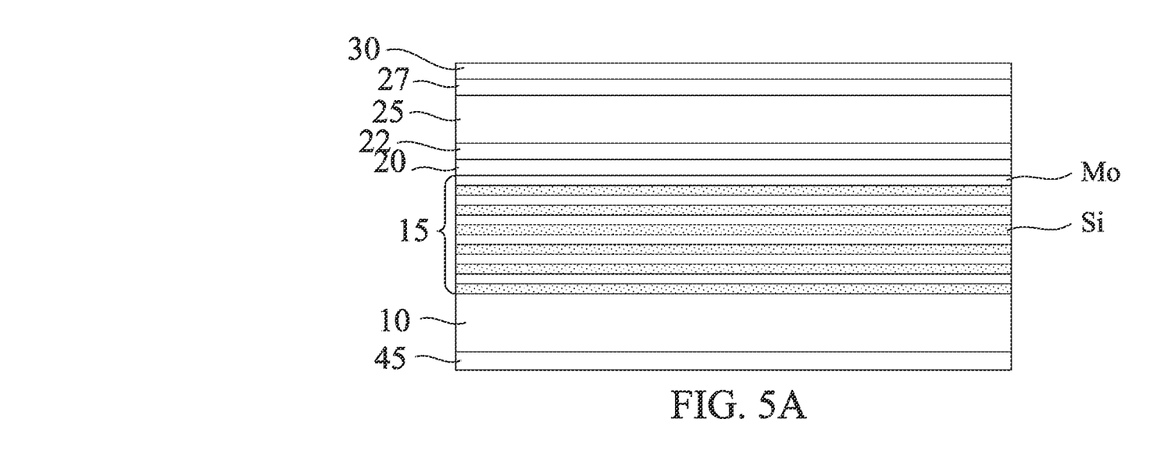
FIG. 5A shows a cross sectional view of a photo mask blank and FIG. 5B shows a cross sectional view of a photo mask according to embodiments of the present disclosure.
Figure 5B:
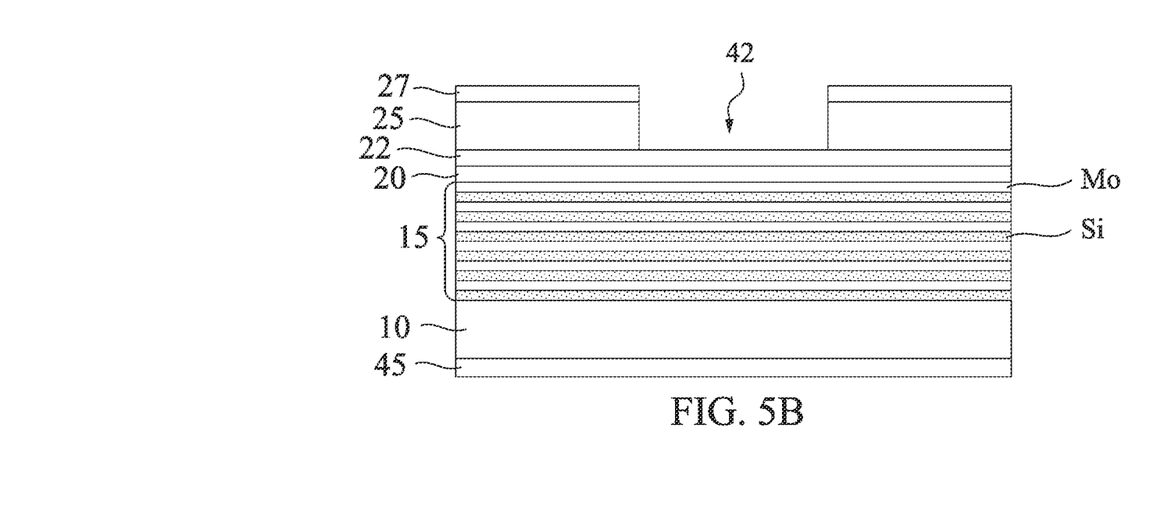

In some embodiments, as shown in FIGS. 5A and 5B, an intermediate layer 22 is formed between the capping layer 20 and the absorber layer 25, and the uppermost layer of the multilayer 15 is a Mo layer. In other words, the uppermost Si layer of the multilayer 15 is not in contact with the capping layer 20. As shown in FIG. 5B, after the circuit pattern 42 is formed, the hard mask layer 30 is removed and thus the EUV photo mask does not include the hard mask layer.

Figure 6A:
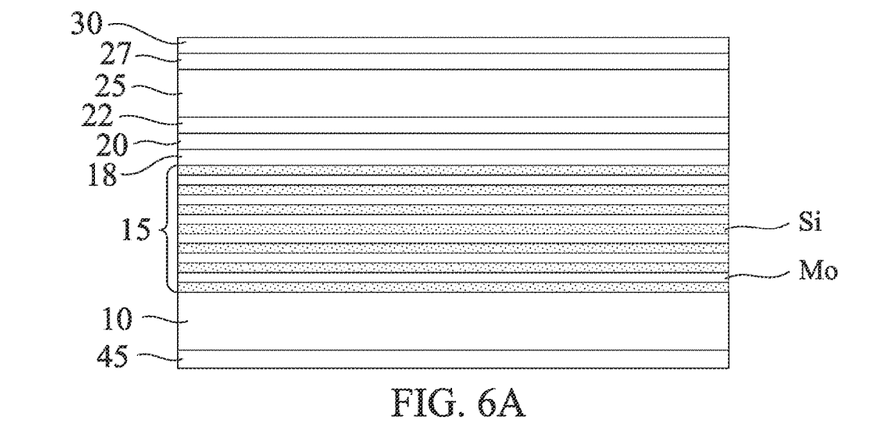
FIG. 6A shows a cross sectional view of a photo mask blank and FIG. 6B shows a cross sectional view of a photo mask according to embodiments of the present disclosure.
Figure 6B:
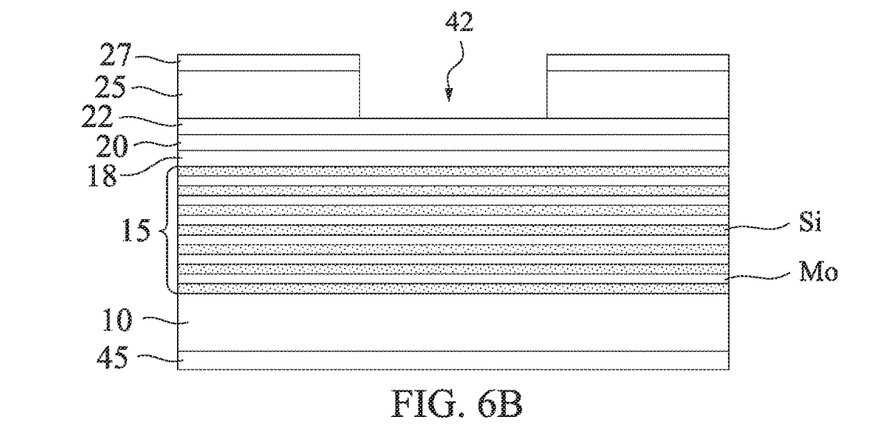

In some embodiments, as shown in FIGS. 6A and 6B, an intermediate layer 22 is formed between the capping layer 20 and the absorber layer 25, and a barrier layer 18 is formed between the multilayer 15 and the capping layer 20. In other words, even if the uppermost layer of the multilayer 15 is a Si layer, the Si layer is not in contact with the capping layer 20. As shown in FIG. 6B, after the circuit pattern 42 is formed, the hard mask layer 30 is removed and thus the EUV photo mask does not include the hard mask layer. In some embodiments, the uppermost layer of the multilayer 15 is a Si layer as shown in FIGS. 6A and 6B, or a Mo layer.

FIGS. 7A-7F and 8A-8D schematically illustrate a method of fabricating an EUV photo mask for use in extreme ultraviolet lithography (EUVL). It is understood that additional operations can be provided before, during, and after processes shown by FIGS. 7A-8D, and some of the operations described below can be replaced or eliminated for additional embodiments of the method. The order of the operations/processes may be interchangeable. FIGS. 7A-7F and 8A-8D are directed to a mask blank having an intermediate layer 22 as shown in FIGS. 2A 4A, 5A and 6A.

Figure 7A:
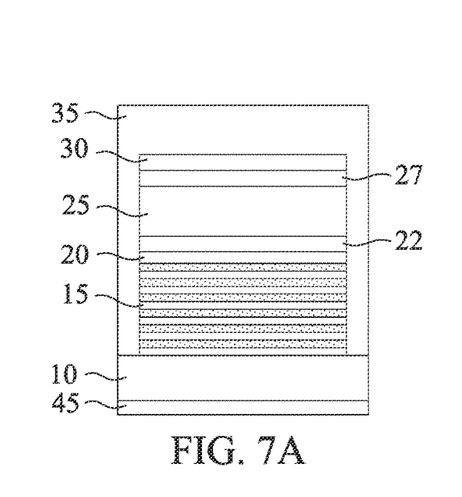
FIGS. 7A, 7B, 7C, 7D, 7E and 7F schematically illustrate a method of fabricating an EUV photo mask according to an embodiment of the present disclosure.
Figure 7B:
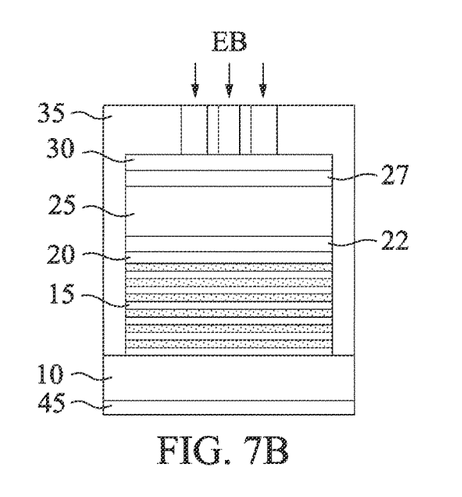
Figure 7C:
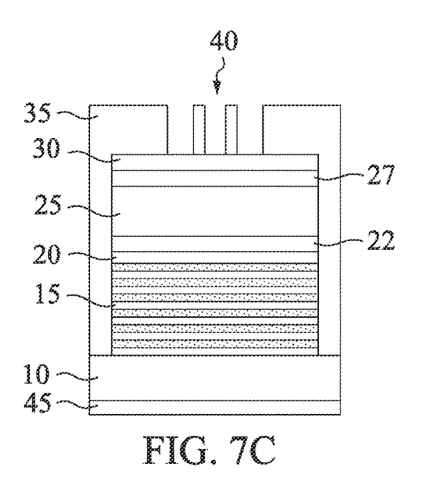

In the fabrication of an EUV photo mask, a first photoresist layer 35 is formed over the hard mask layer 30 of the EUV photo mask blank as shown in FIG. 7A, and the photoresist layer 35 is selectively exposed to actinic radiation EB as shown in FIG. 7B. Before the first photoresist layer 35 is formed, the EUV photo mask blank is subject to inspection in some embodiments. The selectively exposed first photoresist layer 35 is developed to form a pattern 40 in the first photoresist layer 35 as shown in FIG. 7C. In some embodiments, the actinic radiation EB is an electron beam or an ion beam. In some embodiments, the pattern 40 corresponds to a pattern of semiconductor device features for which the EUV photo mask will be used to form in subsequent operations.

Figure 7D:
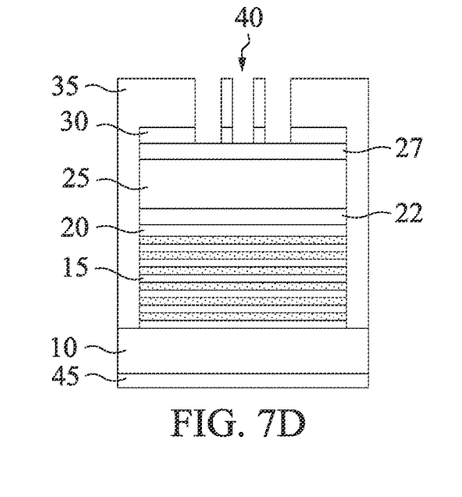
Figure 7E:
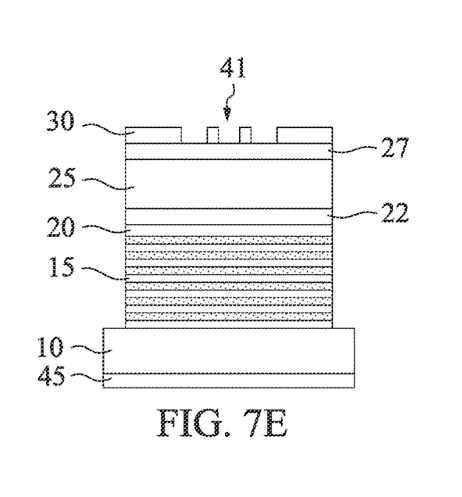

Next, the pattern 40 in the first photoresist layer 35 is extended into the hard mask layer 30 forming a pattern 41 in the hard mask layer 30 exposing portions of the cover layer 27, as shown in FIG. 7D. The pattern 41 extended into the hard mask layer 30 is formed by etching, in some embodiments, using a suitable wet or dry etchant that is selective to the cover layer 27. After the pattern 41 in the hard mask layer 30 is formed, the first photoresist layer 35 is removed by a photoresist stripper to expose the upper surface of the hard mask layer 30, as shown in FIG. 7E.

Figure 7F:
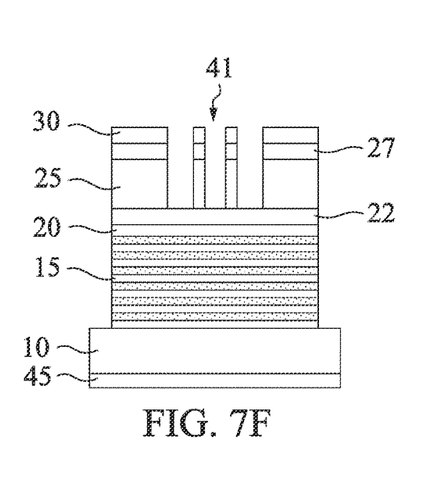
Figure 8A:
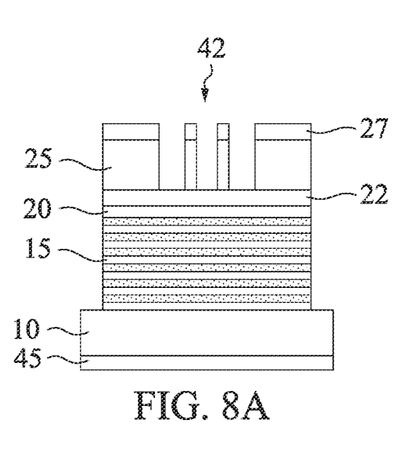
FIGS. 8A, 8B, 8C and 8D schematically illustrate a method of fabricating an EUV photo mask according to an embodiment of the present disclosure.

Then, the pattern 41 in the hard mask layer 30 is extended into the cover layer 27 and the absorber layer 25, thereby forming a pattern 42 (see, FIG. 8A) in the cover layer 27 and the absorber layer 25 exposing portions of the intermediate layer 22, as shown in FIG. 7F, and then the hard mask layer 30 is removed as shown in FIG. 8A. The pattern 42 extended into the cover layer 27 and the absorber layer 25 is formed by etching, in some embodiments, using a suitable wet or dry etchant that is selective to the intermediate layer 22. In some embodiments, plasma dry etching is used. In some embodiments, when the intermediate layer 22 is made of the same material as or similar material to the hard mask layer 30, or when the intermediate layer 22 and the hard mask layer 30 have similar etching resistivity to the etching of the absorber layer 25, the etching substantially stops at the intermediate layer 22. In some embodiments, the cover layer 27 is patterned by using the patterned hard mask layer 30, and then the absorber layer 25 is patterned by using the patterned cover layer 27 as an etching mask with or without the hard mask layer 30 (i.e.—the cover layer functions as a hard mask).

Figure 8B:
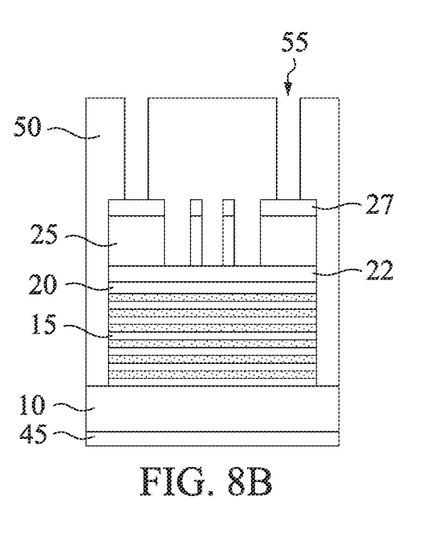

As shown in FIG. 8B, a second photoresist layer 50 is formed over the absorber layer 25 filling the pattern 42 in the cover layer 27 and the absorber layer 25. The second photoresist layer 50 is selectively exposed to actinic radiation such as electron beam, ion beam or UV radiation. The selectively exposed second photoresist layer 50 is developed to form a pattern 55 in the second photoresist layer 50 as shown in FIG. 8B. The pattern 55 corresponds to a black border surrounding the circuit patterns. A black border is a frame shape area created by removing all the multilayers on the EUV photo mask in the region around a circuit pattern area. It is created to prevent exposure of adjacent fields when printing an EUV photo mask on a wafer. The width of the black border is in a range from about 1 mm to about 5 mm in some embodiments.

Figure 8C:
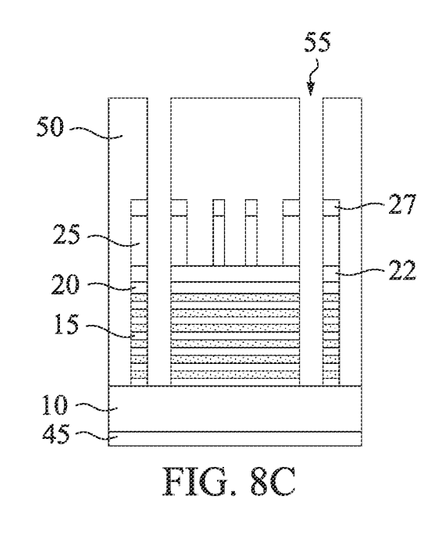

Next, the pattern 55 in the second photoresist layer 50 is extended into the cover layer 27, the absorber layer 25, capping layer 20, and Mo/Si multilayer 15 forming a pattern 57 (see, FIG. 8D) in the absorber layer 25, capping layer 20, and Mo/Si multilayer 15 exposing portions of the substrate 10, as shown in FIG. 8C. The pattern 57 is formed by etching, in some embodiments, using one or more suitable wet or dry etchants that are selective to each of the layers that are etched. In some embodiments, plasma dry etching is used.

Figure 8D:
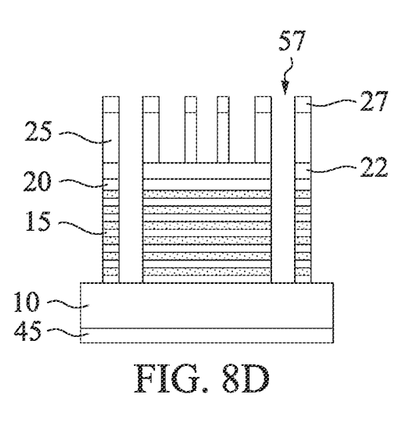

Then, the second photoresist layer 50 is removed by a suitable photoresist stripper to expose the upper surface of the absorber layer 25 as shown in FIG. 8D. The black border pattern 57 in the cover layer 27, the absorber layer 25, capping layer 20, and the Mo/Si multilayer 15 defines a black border of the photo mask in some embodiments of the disclosure.

Figure 9A:
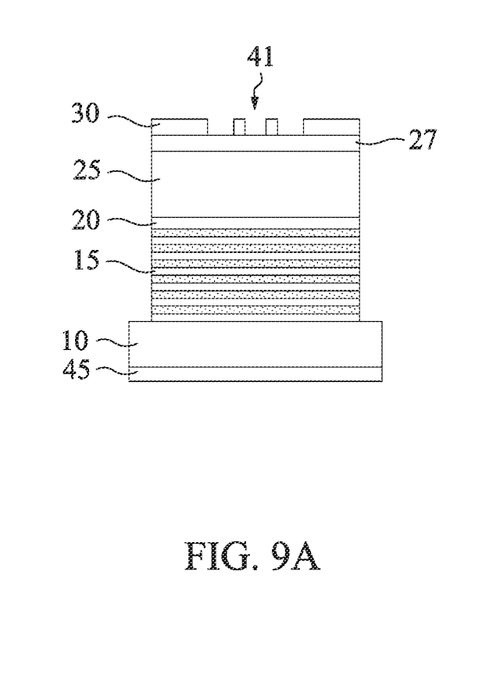
FIGS. 9A, 9B and 9C schematically illustrate a method of fabricating an EUV photo mask according to an embodiment of the present disclosure.
Figure 9B:
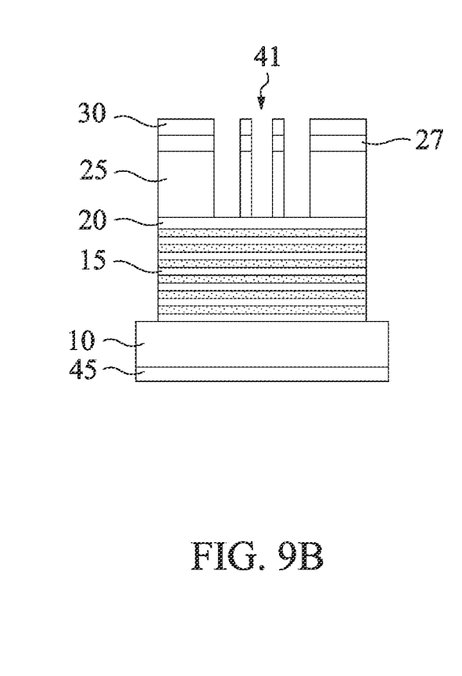
Figure 9C:
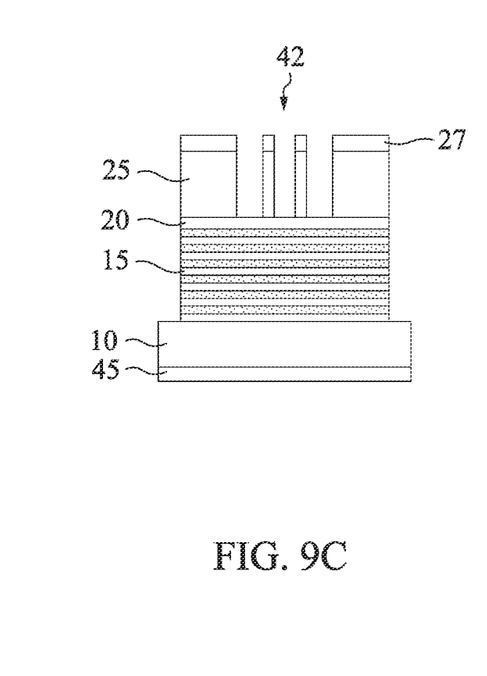

FIGS. 9A, 9B and 9C show cross sectional views of a multilayer structure of an absorber layer according to another embodiment of the present disclosure. It is understood that additional operations can be provided before, during, and after processes shown by FIGS. 9A, 9B, and 9C, and some of the operations described below can be replaced or eliminated, for additional embodiments of the method. The order of the operations/processes may be interchangeable. Materials, configurations, processes and/or dimensions as explained with respect to the foregoing embodiments may be employed in the following embodiments and detailed description thereof may be omitted. The embodiment of FIGS. 9A, 9B and 9C is for a mask blank as shown in FIGS. 2A, and 3A, where no intermediate layer 22 is formed.

FIG. 9A shows a structure after the hard mask layer 30 is patterned similar to FIG. 7E. Then, the cover layer 27 and the absorber layer 25 are patterned (etched) by using the patterned hard mask layer 25 as shown in FIG. 9B. In some embodiments, the etching substantially stops at the capping layer 20. Then, as shown in FIG. 9C, the hard mask layer 30 is removed.

Figure 10A:
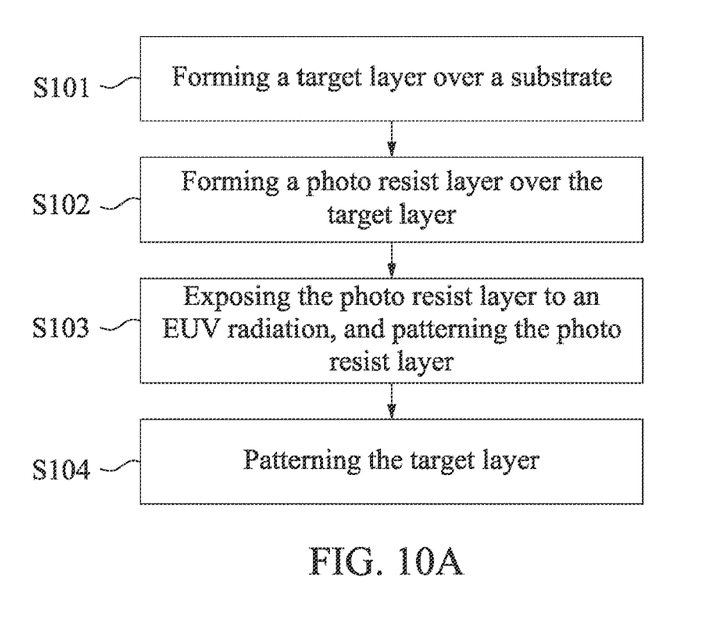
FIG. 10A shows a flowchart of a method making a semiconductor device.
Figure 10B:
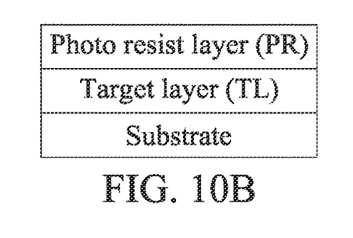
FIGS. 10B, 10C, 10D and 10E show a sequential manufacturing operation of a method of making a semiconductor device in accordance with embodiments of present disclosure.
Figure 10C:
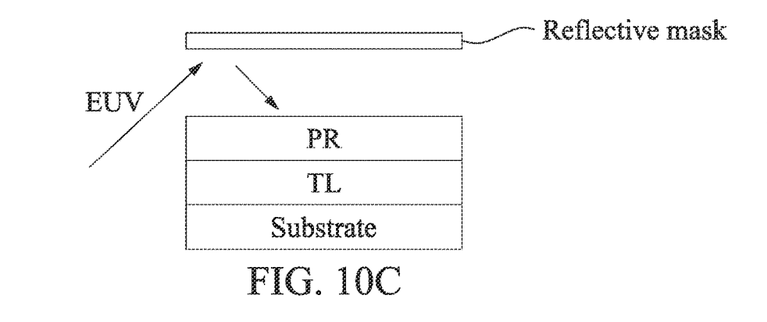

FIG. 10A shows a flowchart of a method of making a semiconductor device, and FIGS. 10B, 10C, 10D and 10E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S101 of FIG. 10A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S102 of FIG. 10A, a photo resist layer is formed over the target layer, as shown in FIG. 10B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable techniques. The coated photo resist layer may be further baked to drive out solvent in the photo resist layer. At S103 of FIG. 10A, the photoresist layer is patterned using an EUV reflective mask as set forth above, as shown in FIG. 10B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

Figure 10D:
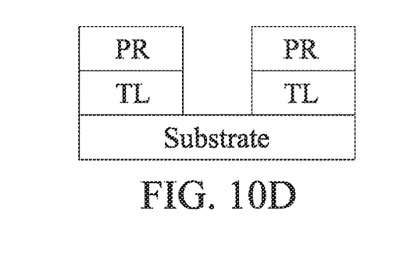
Figure 10E:
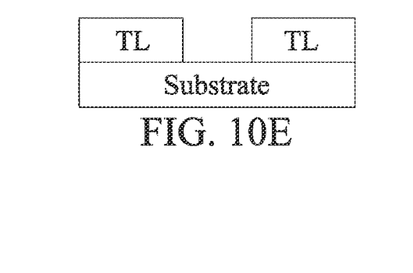

At S104 of FIG. 10A, the target layer is patterned utilizing the patterned photoresist layer as an etching mask, as shown in FIG. 10D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 10E.

In the present disclosure, where an intermediate layer (protection layer) is disposed over a capping layer, it is possible to effectively protect the capping layer during dry etching of the absorber layer. Further, the use of the intermediate layer can reduce carbon or hydrocarbon contamination on the capping layer. Moreover, in some embodiments of the present disclosure, a barrier layer is disposed under the capping layer, which prevents hydrogen diffusion in the EUV mask together with the intermediate layer. Moreover, in some embodiments of the present disclosure, the multilayer is terminated by an Mo layer, which prevents peeling-off of the capping layer form the multilayer.

It will be understood that not all advantages have been necessarily discussed herein, no particular advantage is required for all embodiments or examples, and other embodiments or examples may offer different advantages.

According to one aspect of the present application, a reflective mask includes a substrate, a reflective multilayer disposed on the substrate, a capping layer disposed on the reflective multilayer, an intermediate layer disposed on the capping layer, an absorber layer disposed on the intermediate layer, and a cover layer disposed on the absorber layer. The intermediate layer includes a material having a lower hydrogen diffusivity than a material of the capping layer. In one or more of the foregoing and following embodiments, the intermediate layer includes tantalum oxide. In one or more of the foregoing and following embodiments, a thickness of the intermediate layer is in a range from 0.5 nm to 3 nm. In one or more of the foregoing and following embodiments, the cover layer is made of a same material as the intermediate layer. In one or more of the foregoing and following embodiments, the intermediate layer and the cover layer includes tantalum oxide. In one or more of the foregoing and following embodiments, the reflective mask further includes an opening pattern formed in the cover layer and the absorber layer, and the intermediate layer is exposed at a bottom of the opening. In one or more of the foregoing and following embodiments, the reflective multilayer include Si layers and Mo layers alternately stacked, and a Si layer of the reflective multilayer is in contact with the capping layer. In one or more of the foregoing and following embodiments, the reflective multilayer include Si layers and Mo layers alternately stacked, and a Mo layer of the reflective multilayer is in contact with the capping layer.

In accordance with another aspect of the present disclosure, a reflective mask includes a substrate, a reflective multilayer disposed on the substrate, a barrier layer disposed on the reflective multilayer, a capping layer disposed on the barrier layer, an absorber layer disposed on the capping layer, and a cover layer disposed on the absorber layer. The barrier layer includes one or more of SiON or SiN. In one or more of the foregoing and following embodiments, a thickness of the barrier layer is in a range from 0.5 nm to 5 nm. In one or more of the foregoing and following embodiments, the reflective mask further includes an intermediate layer between the capping layer and the absorber layer. In one or more of the foregoing and following embodiments, the intermediate layer includes at least one of tantalum oxide, niobium oxide, or ruthenium oxide. In one or more of the foregoing and following embodiments, the intermediate layer includes at least one of titanium oxide ($TiO_2$), tin oxide (SnO), zinc oxide (ZnO) or cadmium sulfide (CdS). In one or more of the foregoing and following embodiments, the reflective multilayer include Si layers and Mo layers alternately stacked, and a Si layer of the reflective multilayer is in contact with the barrier layer. In one or more of the foregoing and following embodiments, the reflective multilayer include Si layers and Mo layers alternately stacked, and a Mo layer of the reflective multilayer is in contact with the barrier layer.

In accordance with another aspect of the present disclosure, a reflective mask includes a substrate, a reflective multilayer disposed on the substrate, a barrier layer disposed on the reflective multilayer, a capping layer disposed on the barrier layer, an absorber layer disposed on the capping layer, and a cover layer disposed on the absorber layer. The reflective multilayer include Si layers and Mo layers alternately stacked, and an uppermost Si layer of the reflective multilayer is not in contact with the capping layer. In one or more of the foregoing and following embodiments, the cover layer is made of tantalum oxide. In one or more of the foregoing and following embodiments, a silicon compound layer is inserted between the multilayer and the capping layer. In one or more of the foregoing and following embodiments, an uppermost Mo layer of the reflective multilayer is not in contact with the capping layer. In one or more of the foregoing and following embodiments, the capping layer is made at least one of RuNb, RuZr, RuZrN, RuRh, RuNbN, RuRhN, RuV or RuVN.

In accordance with another aspect of the present disclosure, in a method of method of manufacturing a reflective mask, a photo resist layer is formed over a mask blank. The mask blank includes a substrate, a reflective multilayer on the substrate, a capping layer on the reflective multilayer, an intermediate layer on the capping layer, an absorber layer on the intermediate layer, a cover layer on the absorber layer and a hard mask layer on the cover layer. The photo resist layer is patterned, the hard mask layer is patterned by using the patterned photo resist layer, the cover layer and the absorber layer are patterned by using the patterned hard mask layer to form an opening, and the hard mask layer is removed. A part of the intermediate layer is exposed in the opening after the hard mask layer is removed. In one or more of the foregoing and following embodiments, the cover layer is made of a same material as the intermediate layer. In one or more of the foregoing and following embodiments, the intermediate layer and the cover layer includes tantalum oxide. In one or more of the foregoing and following embodiments, the hard mask layer includes CrO or CrON. In one or more of the foregoing and following embodiments, the absorber layer is made of TaBN. In one or more of the foregoing and following embodiments, the capping layer is made of Ru. In one or more of the foregoing and following embodiments, a thickness of the intermediate layer is in a range from 0.5 nm to 3 nm.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an intermediate layer on the capping layer, an absorber layer on the intermediate layer, a cover layer on the absorber layer and a hard mask layer on the cover layer. The photo resist layer is patterned, the hard mask layer is patterned by using the patterned photo resist layer, the cover layer and the absorber layer are patterned by using the patterned hard mask layer to form an opening, and the hard mask layer is removed. The reflective multilayer includes Si layers and Mo layers alternately stacked, and an uppermost Si layer of the reflective multilayer is not in contact with the capping layer. In one or more of the foregoing and following embodiments, a part of the intermediate layer is exposed in the opening after the hard mask layer is removed. In one or more of the foregoing and following embodiments, at least one of the intermediate layer and the cover layer includes tantalum oxide. In one or more of the foregoing and following embodiments, a silicon compound layer is inserted between the multilayer and the capping layer. In one or more of the foregoing and following embodiments, the silicon compound layer includes one or more of SiON or SiN. In one or more of the foregoing and following embodiments, a thickness of the silicon compound layer is in a range from 0.5 nm to 5 nm. In one or more of the foregoing and following embodiments, an uppermost Mo layer of the reflective multilayer is not in contact with the capping layer.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an absorber layer on the capping layer, a cover layer on the absorber layer and a hard mask layer on the cover layer. The photo resist layer is patterned, the hard mask layer is patterned by using the patterned photo resist layer, the cover layer and the absorber layer are patterned by using the patterned hard mask layer to form an opening, and the hard mask layer is removed. The reflective multilayer include Si layers and Mo layers alternately stacked, an uppermost Si layer of the reflective multilayer is not in contact with the capping layer, and a part of the capping layer is exposed in the opening after the hard mask layer is removed. In one or more of the foregoing and following embodiments, the cover layer includes tantalum oxide. In one or more of the foregoing and following embodiments, a barrier layer is inserted between the multilayer and the capping layer. In one or more of the foregoing and following embodiments, the barrier layer includes one or more of SiON or SiN. In one or more of the foregoing and following embodiments, a thickness of the barrier layer is in a range from 0.5 nm to 5 nm. In one or more of the foregoing and following embodiments, an uppermost layer of the reflective multilayer is a Mo layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A reflective mask, comprising:
a substrate;
a reflective multilayer disposed on the substrate;
a barrier layer;
a capping layer disposed over the barrier layer;
an intermediate layer disposed over the capping layer; and
an absorber layer disposed over the intermediate layer,
wherein the intermediate layer includes a material having a lower hydrogen diffusivity than a material of the capping layer.
2. The reflective mask of claim 1, wherein the intermediate layer includes tantalum oxide.

3. The reflective mask of claim 1, wherein a thickness of the intermediate layer is in a range from 0.5 nm to 3 nm.

4. The reflective mask of claim 1, wherein the intermediate layer includes ruthenium oxide, niobium oxide, or molybdenum oxide.

5. The reflective mask of claim 1, further comprising an opening pattern formed in the absorber layer,
wherein the intermediate layer is exposed at a bottom of the opening pattern.

6. The reflective mask of claim 1, wherein the barrier layer includes one or more of SiON or SiN.

7. The reflective mask of claim 1, wherein the barrier layer is made of Mo.

8. The reflective mask of claim 1, wherein:
the reflective multilayer includes Si layers and Mo layers alternately stacked, and
a Si layer of the reflective multilayer is in contact with the barrier layer.

9. A reflective mask, comprising:
a substrate;
a reflective multilayer disposed on the substrate;
a barrier layer disposed on the reflective multilayer;
a capping layer disposed on the barrier layer; and
an absorber layer disposed on the capping layer;
wherein the barrier layer includes one or more of SiON or SiN.

10. The reflective mask of claim 9, wherein a thickness of the barrier layer is in a range from 0.5 nm to 5 nm.

11. The reflective mask of claim 9, further comprising an intermediate layer between the capping layer and the absorber layer.

12. The reflective mask of claim 11, wherein the intermediate layer includes at least one of tantalum oxide, niobium oxide, or ruthenium oxide.

13. The reflective mask of claim 11, wherein the intermediate layer includes at least one of titanium oxide ($TiO_2$), tin oxide (SnO), zinc oxide (ZnO) or cadmium sulfide (CdS).

14. The reflective mask of claim 9, wherein:
the reflective multilayer includes Si layers and Mo layers alternately stacked, and
a Si layer of the reflective multilayer is in contact with the barrier layer.

15. The reflective mask of claim 9, wherein:
the reflective multilayer includes Si layers and Mo layers alternately stacked, and
a Mo layer of the reflective multilayer is in contact with the barrier layer.

16. A reflective mask, comprising:
a substrate;
a reflective multilayer disposed over the substrate;
a capping layer disposed over the reflective multilayer;
an absorber layer disposed over the capping layer; and
a cover layer disposed over the absorber layer, wherein:
the reflective multilayer includes Si layers and Mo layers alternately stacked, and
an uppermost Si layer of the reflective multilayer is not in contact with the capping layer.

17. The reflective mask of claim 16, wherein the cover layer is made of tantalum oxide.

18. The reflective mask of claim 16, wherein a silicon compound layer is disposed between the reflective multilayer and the capping layer.

19. The reflective mask of claim 16, wherein an uppermost Mo layer of the reflective multilayer is not in contact with the capping layer.

20. The reflective mask of claim 16, wherein the capping layer is made of at least one of RuNb, RuZr, RuZrN, RuRh, RuNbN, RuRhN, RuV or RuVN.

* * * * *